United States Patent [19]
Chautemps et al.

[11] Patent Number: 4,553,168
[45] Date of Patent: Nov. 12, 1985

[54] METHOD AND APPARATUS FOR ADJUSTING THE OPERATING CONDITIONS OF A PHOTOSENSITIVE CHARGE TRANSFER DEVICE

[75] Inventors: Jacques Chautemps, St. Egreve; Pierrick Descure, Biviers, both of France

[73] Assignee: Thomson-CSF, Paris, France

[21] Appl. No.: 558,506

[22] Filed: Dec. 6, 1983

[30] Foreign Application Priority Data

Dec. 10, 1982 [FR] France .............................. 82 20763

[51] Int. Cl.[4] ............................................. H04N 3/14
[52] U.S. Cl. ................................................ 358/213
[58] Field of Search ..................... 358/213; 307/200 R, 307/607; 365/183; 377/58, 61, 62

[56] References Cited

U.S. PATENT DOCUMENTS 4,055,836 10/1977 Weimer ................................. 377/58
4,499,497 2/1985 Levine .................................. 358/213

Primary Examiner—Gene Z. Rubinson
Assistant Examiner—L. C. Schroeder

[57] ABSTRACT

The charges induced by the light image to be scanned are integrated cyclically. During each integration cycle, the total amplitude of the signal corresponding to said image is calculated. The calculated amplitude is compared with a threshold amplitude value which is a function of a saturation value which is itself fixed by the amplitude of a periodic bias voltage applied to the device. The amplitude of the potential wells created by said bias voltage is modulated as a function of the result of said comparison. The invention is applicable to solid state TV cameras, e.g. for use in low light.

6 Claims, 6 Drawing Figures

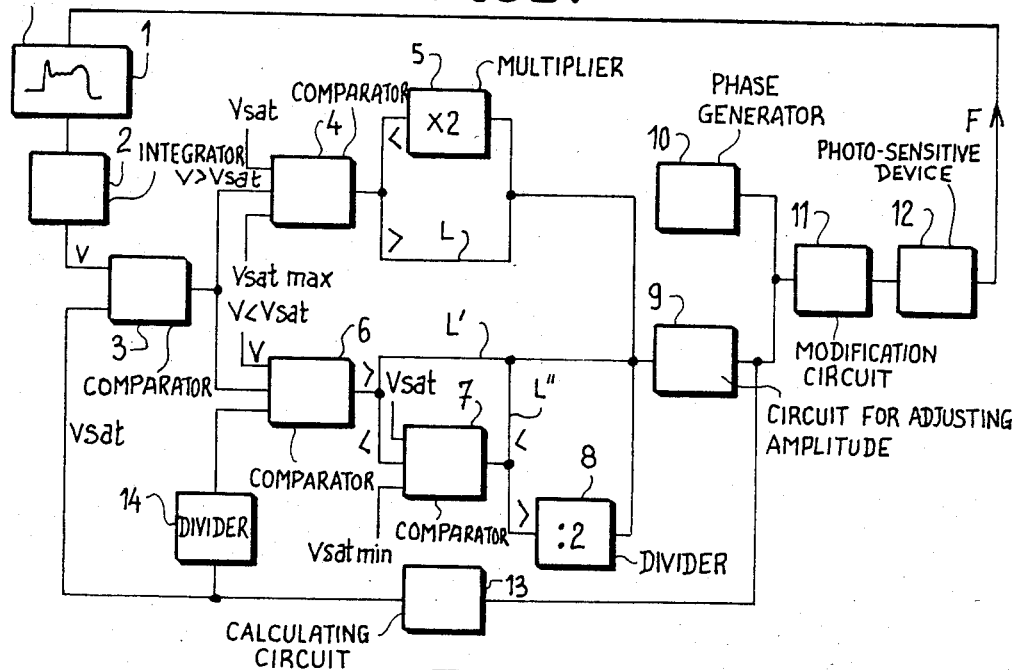
FIG_1
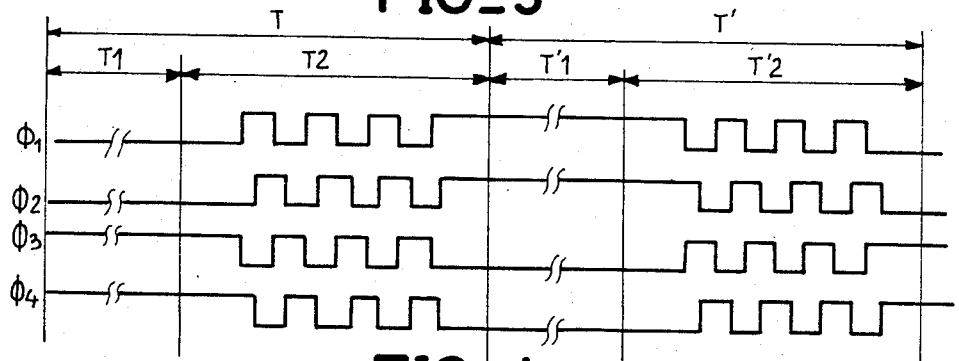
FIG_3
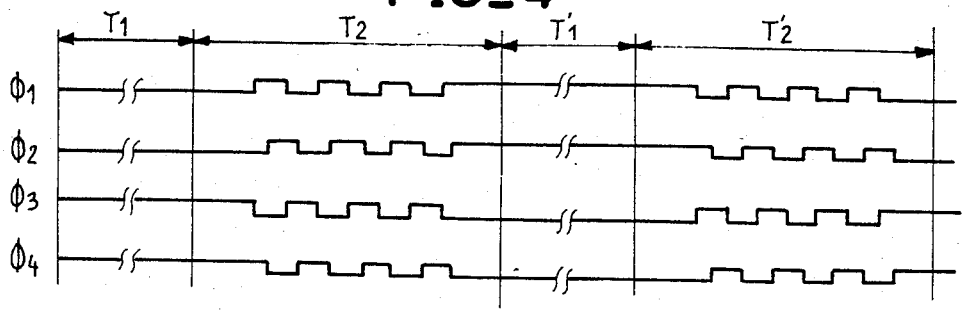
FIG_4

FIG_2-a
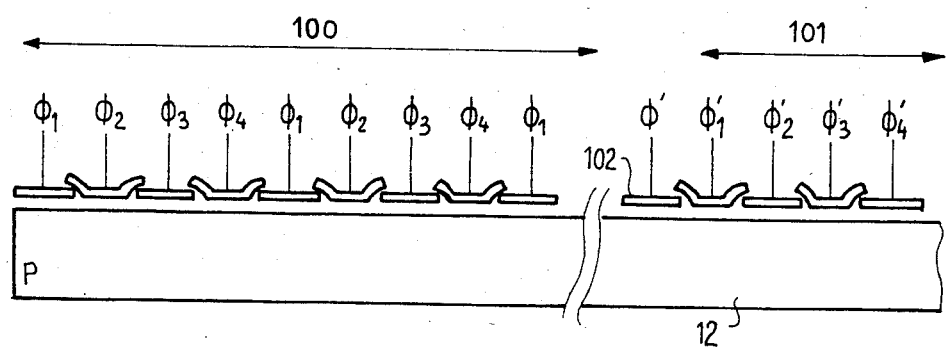
FIG_2-b
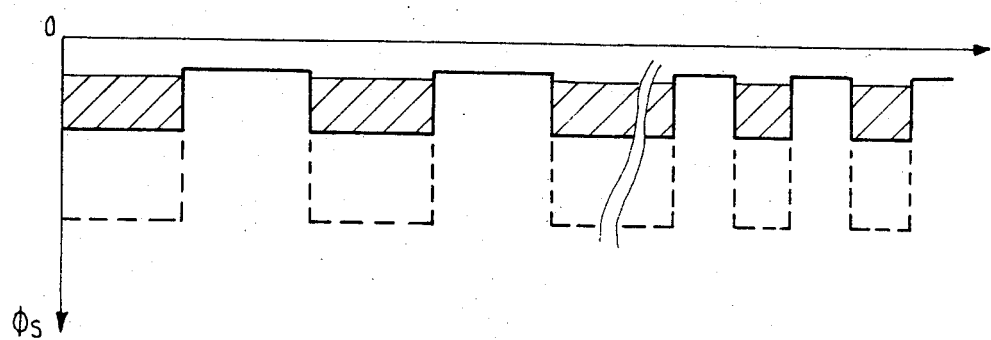
FIG_2-c
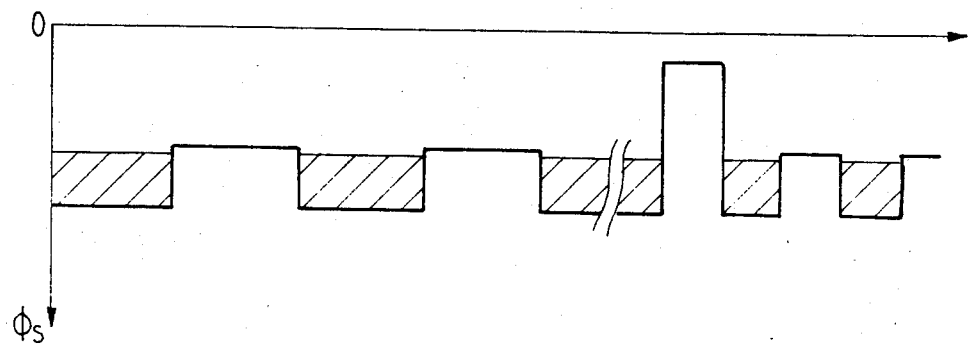

METHOD AND APPARATUS FOR ADJUSTING THE OPERATING CONDITIONS OF A PHOTOSENSITIVE CHARGE TRANSFER DEVICE

The present invention relates to a method and to apparatus for adjusting the operating conditions of a photosensitive charge transfer device as is mainly used under very low lighting conditions.

BACKGROUND OF THE INVENTION

The photosensitive charge transfer devices to which the present invention relates are also known as "charged coupled devices" or "CCD" and they are generally of the area type although they may in special circumstances be linear. In either case, light radiation is applied to charge transfer registers. Such devices are now wellknown in themselves and are described, in particular, in the work by C. H. Sequin and M. F. Thompsett entitled "Charge transfer devices", page 142 et seq. The present invention is applicable to charge transfer devices which are linear charge coupled devices or surface area charge coupled devices using three or four control phases.

In prior art photosensitive charge transfer devices, the bias voltage applied to the charge transfer registers in the image zones and in the memory zones is fixed once and for all regardless of the level of illumination received by the image zone. However, this bias voltage determines the depth of the potential well created under said registers, in other words it determines the storage capacity of minority carriers. As a result, if the level of illumination is very much less than the chosen saturation level of illumination, the degree to which the potential wells are filled will be very small. Unfortunately, the depth of the potential wells has both direct and indirect effects on various features such as dark current, noise due to the control phases, etc.

The object of the present invention is to mitigate the above-mentioned drawbacks by providing a method of adjusting the operating conditions of a charge transfer device together with an apparatus for performing the method. In particular, the dark current, and consequently the power consumption can be reduced by implementing the invention, as can the noise due to the control phases.

SUMMARY OF THE INVENTION

The present invention provides a method of adjusting the operating conditions of a photosensitive charge transfer device having a photosensitive zone which is constituted by charge transfer registers each having electrodes connected to a periodic bias voltage which creates potential wells having a saturation value fixed by said bias voltage, the improvement wherein the method consists in cyclically integrating the charges induced by the light image to be scanned, and, during each integration cycle, in calculating the total amplitude of the signal corresponding to said image, in comparing said calculated amplitude with a threshold amplitude value which is a function of said saturation value fixed by said bias voltage, and in modulating the amplitude of said potential wells created by said bias voltage as a function of the result of said comparison.

In the context of the present invention, the term "light image" refers not only to visible wavelengths but also to adjacent wavelengths, and in particular to infrared wavelengths.

The amplitude of the potential wells may be modulated by modulating the high level or by modulating the low level of the bias voltage applied to the electrodes, i.e. the control phases of the charge transfer registers. This modulation may be obtained by successive multiplications or divisions, preferably doublings and halvings, of the bias voltage as applied to the electrodes. Naturally, the bias voltage should remain within given upper and lower limits. Since the saturation voltage of the potential wells thus created is a linear function of the bias voltage of the control phases of the charge transfer registers, the amplitude of the potential wells and thus their capacity, is decreased or increased by dividing or by multiplying said bias voltage by an integer.

The present invention also provides apparatus for performing the above-defined method. The apparatus comprises calculator means for calculating, during each integration cycle of a light image, the amplitude of the video signal corresponding to said image, comparator means for comparing the calculated amplitude with an amplitude value which is a function of the saturation value corresponding to the bias voltage applied to the shift registers, and amplitude modulating means responsive to the result of said comparison to modulate the amplitude of the potential wells created by said bias voltage as a function of said result.

Preferably, the amplitude modulating means is constituted by a circuit for dividing the bias voltage by two if the calculated amplitude is less than a fraction of said threshold value and providing the bias voltage is greater than its minimum value, and by a circuit for multiplying the bias voltage by two if the calculated amplitude is greater than the threshold value and providing the bias voltage is less than its maximum value.

BRIEF DESCRIPTION OF THE DRAWINGS

An embodiment of the invention is described by way of example with reference to the accompanying drawings, in which:

FIG. 1 is a block diagram of one implementation of the invention for servo control of the amplitude of the potential wells created beneath the electrodes of the charge transfer registers;

FIG. 2a is a longitudinal section through a surface area photosensitive device for transferring a frame and of the type requiring four control phases;

FIG. 2b shows the levels of the surface potentials during charge integration in accordance with a first mode of performing the method of the present invention;

FIG. 2c is a similar view to FIG. 2b but shows a second mode of performing the invention;

FIG. 3 is a waveform diagram showing conventional control signals as applied to the registers in the image zone of the device shown in FIG. 2a, and FIG. 4 is a waveform diagram of the control signals as applied in the case shown in FIG. 2b.

In the figures, the same references are used to designate the same items. However, for reasons of clarity, relative sizes and proportions may be exaggerated.

MORE DETAILED DESCRIPTION

FIG. 1 shows one embodiment of the invention in which a servo circuit is associated with a photosensitive charge transfer device or photosensor to modulate the amplitude of the potential wells created under the electrodes which constitute the photosensitive zone of the photosensor in such a manner as to match the depth of the potential wells to the received illumination.

Reference 1 designates the waveform of the signal corresponding to the received light image during one integration cycle, i.e. one frame of the photosensor. The signal is sent to an integrator 2 to calculate the overall voltage of the points making up the light image. In the present invention, the signal corresponding to a frame is integrated in order to take account of the illumination over the entire light image and not just the illumination of a single point. The voltage V obtained at the output from the integrator 2 is applied to a comparator 3 where it is compared with a threshold voltage which is equal, for example, to the saturation voltage which corresponds to the bias voltage applied to the electrodes of the registers in the photosensitive zone, as is explained in detail below. If the voltage V is greater than the saturation voltage, a comparator 4 is used to compare the saturation voltage Vsat with the maximum value for saturation voltage Vsat max. If Vsat is less than Vsat max., the amplitude of the bias voltage applied to said electrodes is multiplied, e.g. by two, by means of a circuit 5. Otherwise, the said amplitude is left unchanged as represented by a line L in FIG. 1. If, on the contrary, the voltage V is less than the saturation voltage, a comparator 6 is used to compare the voltage V with a voltage equal to (Vsat)/n. If the voltage V is greater than said comparison voltage, the amplitude of the bias voltage applied to the electrodes remains unchanged as is represented by the line L'. However, if the voltage V is less than the reference voltage (Vsat)/n, a comparator 7 is used to compare Vsat with Vsat min. If Vsat is less than Vsat min., the bias voltage applied to the electrodes remains unchanged as represented by the line L" in FIG. 1, but if Vsat is greater than Vsat min., the bias voltage applied to the electrodes is divided, e.g. by two, by means of a divider circuit 8. The multiplier circuit 5 and the divider circuit 8 may both be constituted by potentiometers for adjusting the amplitude of the bias voltage applied to the electrodes or gates of the registers in the photosensitive zone, i.e. the amplitude of the control phases (9).

The circuit 9 for adjusting the amplitude of the control phases acts on a phase generator 10 for applying control phases to the said photosensitive device 12. The amplitude of said phases is modified in accordance with the waveform diagram shown in FIG. 4 and symbolised in FIG. 1 by the reference 11.

Reference 13 designates a circuit for calculating Vsat from the bias voltage applied to the electrodes given that Vsat is a linear function of said bias voltage. Reference 14 designates a divider circuit for generating (Vsat)/n. Arrow F indicates that the light image given by the charge transfer device is used for calculating the voltage V.

An embodiment of the photosensitive charge transfer device 12 is now described with reference to FIG. 2a. The device is a surface area photosensitive device of the frame transferring type and constituted in known manner from a set of vertically disposed charge transferring shift registers having an upper portion which is photosensitive and which constitutes the image zone 100 and having a lower portion which serves for temporary storage of the charges and which constitutes a memory zone 101. An independently-controlled ($\emptyset'$), transfer gate 102 is located in between the image zone 100 and the memory zone 101. The device 12 further includes a charge transfer shift register having parallel inputs and a serial output (not shown) said register serving to receive the charges coming from the vertical registers and to transfer them to a read stage. The vertical shift registers in the image zone 100 and the memory zone 101 are formed in known manner by means of a network of adjacent MOS capacitors which are separated from one another by very small gaps. By way of example, the MOS capacitors may be obtained by covering P type or N type silicon substrate with a layer of silicon oxide on which the gates or electrodes are made from polycrystalline silicon. However, it is obvious to the person skilled in the art, that other materials could be used, e.g. gallium arsenide for the substrate and a metal for the gates. Furthermore, as shown in FIG. 2a, the photosensitive device is a device having four control phases, and consequently the electrodes of the registers are connected to respective phases $\emptyset_1, \emptyset_2, \emptyset_3, \emptyset_4$ for the image zone and $\emptyset_1', \emptyset_2', \emptyset_3', \emptyset_4'$ for the memory zone. Nonetheless, the present invention may be used with any kind of photosensitive device in which one-way transfer is obtained by using a suitable plurality of control phases.

The operation of the photosensitive device described above is now described with particular reference to FIGS. 2b, 2c, 3 and 4.

When the received signal voltage is less than the threshold voltage and the amplitude of the bias voltage, i.e. the amplitude of the phases, has not been modulated, the control phases $\emptyset_1, \emptyset_2, \emptyset_3, \emptyset_4$ as shown in FIG. 3 are applied to the electrodes or gates in the image zone. Times T and T' represent respective odd and even frames, with $T_1$ and $T_1'$ representing the active portion of each frame and $T_2$ and $T_2'$ representing the blanking portions thereof. Thus, during time $T_1$ the charges corresponding to received light photons are integrated under the gates controlled by phases $\emptyset_1$ and $\emptyset_2$, and during time $T_1'$ charges are integrated under the gates controlled by phases $\emptyset_3$ and $\emptyset_4$. The charges integrated in this manner are subsequently transferred during times $T_2$ and $T_2'$ from the image zone 100 towards the memory zone 101 while the transfer gate 102 is at a high level.

However, if the light image voltage is less than (Vsat)/n, and Vsat is greater than Vsat min., then, in accordance with the method of the present invention, the bias voltage is divided. In the present case, the amplitude of the control phases is divided by two and the waveform diagram shown in FIG. 4 is obtained. Using the FIG. 4 waveform diagram, surface potential levels beneath the electrodes in the image zone and in the memory zone of the kind shown in FIG. 2b are obtained during the charge integration time $T_1$. It can thus be seen on this figure that the potential wells created beneath the gates correspsonding to phases $\emptyset_1$ and $\emptyset_2$ are of a depth which is slightly less than half the depth of the potential wells created when the normal bias voltage is applied and as shown in dashed lines in FIG. 2b. The case shown corresponds to a single division of the bias voltage by two. However, if necessary, the bias voltage could be divided by two again as a function of the received illumination, and the depth of the potential wells would be reduced accordingly. This operation may be repeated or inverted as often as necessary in order to obtain potential wells having a satisfactory depth as a function of the received illumination, provided that the bias voltage remains within given limit values.

Further, instead of modifying the upper level of the control phases as shown in FIG. 2b, it is also possible to modulate the lower level of the control phases as shown in FIG. 2c. This requires the lower level to be different from ground and to remain greater than the substrate potential.

Furthermore, with the above-described method, it may be advantageous in the event of low light levels to increase the dynamic operation rate to the detriment of resolution by grouping together the charges corresponding to two or more points. To obtain such results, cells are reset after every two point rather than being reset after every point. In this case, the signal is multiplied by two while the photon noise is multiplied by $\sqrt{2}$, and reading noise occurs only once. The signal/noise ratio is thus multiplied by at least $\sqrt{2}$.

We claim:

1. A method of adjusting the operating conditions of a photosensitive charge transfer device having a photosensitive zone which is constituted by charge transfer registers each having electrodes connected to a periodic bias voltage which creates potential wells having a saturation value fixed by said bias voltage, the improvement wherein the method consists in cyclically integrating the charges induced by the light image to be scanned, and, during each integration cycle, in calculating the total amplitude of the signal corresponding to said image, in comparing said calculated amplitude with a threshold amplitude value which is a function of said saturation value fixed by said bias voltage, and in modulating the amplitude of said potential wells created by said bias voltage as a function of the result of said comparison.

2. A method according to claim 1, wherein the amplitude of said potential wells is modulated by modulating the high level of the bias voltage applied to said electrodes of said charge transfer registers.

3. A method according to claim 2, wherein the level of said bias voltage is modulated by successive multiplications or divisions of said bias voltage, said voltage remaining between given upper and lower limits.

4. A method according to claim 1, wherein the amplitude of said potential wells is modulated by modulating the low level of said bias voltage where said low level is different from ground potential and greater than substrate potential.

5. Apparatus for performing the method according to claim 1, wherein the apparatus comprises calculator means for calculating, during each integration cycle of a light image, the amplitude of the video signal corresponding to said image, comparator means for comparing the calculated amplitude with an amplitude value which is a function of the saturation value corresponding to the bias voltage applied to the shift registers, and amplitude modulating means responsive to the result of said comparison to modulate the amplitude of the potential wells created by said bias voltage as a function of said result.

6. Apparatus according to claim 5, wherein said amplitude modulating means is constituted by a circuit for dividing the bias voltage by two if the calculated amplitude is less than a fraction of said threshold value and providing the bias voltage is greater than its minimum value, and by a circuit for multiplying the bias voltage by two if the calculated amplitude is greater than the threshold value and providing the bias voltage is less than its maximum value.

* * * * *